United States Patent
Liu et al.

(10) Patent No.: US 11,604,153 B2
(45) Date of Patent: Mar. 14, 2023

(54) METHOD OF PREPARING A SAMPLE FOR PHYSICAL ANALYSIS

(71) Applicant: MSSCORPS CO., LTD., Hsinchu (TW)

(72) Inventors: Chi-Lun Liu, Hsinchu (TW);
Jung-Chin Chen, Hsinchu (TW);
Bang-Hao Huang, Hsinchu (TW);
Yu-Han Chen, Hsinchu (TW)

(73) Assignee: MSSGORPS CO., LTD., Hsinchu (TW)

( * ) Notice: Subject to any disclaimer, the term of this patent is extended or adjusted under 35 U.S.C. 154(b) by 275 days.

(21) Appl. No.: 17/071,002

(22) Filed: Oct. 15, 2020

(65) Prior Publication Data

US 2021/0190707 A1 Jun. 24, 2021

(30) Foreign Application Priority Data

Dec. 19, 2019 (TW) ................. 108146591

(51) Int. Cl.
*C23C 16/30* (2006.01)
*G01N 23/2251* (2018.01)
*H01L 21/02* (2006.01)
*C23C 16/455* (2006.01)

(52) U.S. Cl.
CPC ... *G01N 23/2251* (2013.01); *C23C 16/45544* (2013.01); *H01L 21/0228* (2013.01)

(58) Field of Classification Search
CPC ... C23C 16/45525; C23C 16/30; C23C 16/34; C23C 1/40; C23C 16/308
See application file for complete search history.

(56) References Cited

U.S. PATENT DOCUMENTS

| | | | |
|---|---|---|---|
| 8,274,777 B2 * | 9/2012 | Kiehlbauch | H01L 28/90 361/312 |
| 2004/0046189 A1 * | 3/2004 | Chu | H01L 21/31111 257/E21.507 |
| 2005/0009267 A1 * | 1/2005 | Belyansky | H01L 27/10829 438/389 |
| 2006/0014385 A1 * | 1/2006 | Kim | H01L 27/10852 257/E21.648 |
| 2008/0274282 A1 * | 11/2008 | Bent | C23C 16/45525 427/255.28 |

(Continued)

FOREIGN PATENT DOCUMENTS

| JP | 2011-198885 | * 10/2006 | ........... H01L 21/205 |
|---|---|---|---|
| KR | 2003088750 | * 5/2002 | ........... H01L 21/31 |

OTHER PUBLICATIONS

Jakschik, Stefan, et al., "Physical characterization of thin ALD-Al2O3 films". Applied Surface Science 211 (2003) 352-259.*

(Continued)

*Primary Examiner* — Bret P Chen

(57) ABSTRACT

A method of preparing a sample for physical analysis is disclosed, which is characterized by forming a low-temperature atomic layer deposition (ALD) metal nitride film or a low-temperature atomic layer deposition (ALD) metal oxynitride film by plasma-less enhanced atomic layer deposition (PLALD) at a temperature below 40° C. on a specimen to generate a sample for physical analysis to prevent the surface of sample for physical analysis from being damaged during physical analysis.

9 Claims, 3 Drawing Sheets

(56) References Cited

U.S. PATENT DOCUMENTS

| | | | | |
|---|---|---|---|---|
| 2011/0233500 | A1* | 9/2011 | Nishimura | H01L 27/2409 257/E45.001 |
| 2015/0147824 | A1* | 5/2015 | Cameron | C23C 16/44 556/412 |
| 2017/0005365 | A1* | 1/2017 | Nakai | C23C 16/45561 |
| 2018/0223427 | A1* | 8/2018 | Arl | C23C 16/45527 |
| 2018/0265973 | A1* | 9/2018 | Firouzdor | C23C 16/45527 |
| 2019/0078206 | A1* | 3/2019 | Wu | C23C 16/45565 |
| 2019/0078209 | A1* | 3/2019 | Boccard | C23C 16/403 |
| 2019/0216742 | A1* | 7/2019 | Neikirk | C23C 16/458 |

OTHER PUBLICATIONS

Schiffbaure, James D., et al., "Novel Application of Focused Ion Beam Electron Microscopy (FIB-EM) in Preparation and Analysis of Microfossil Ultrastructures: A New View of Complexity in Early Eukaryotic Organisms". Palaios, 2009, v.24, p. 616-626.*

Graham, Giles A., et al., "Applied focused ion beam techniques for sample preparation of astromaterials for integrated nanoanalysis". Meteoritics & Planetary Science 43, Nr 3, 561-569 (2008).*

Hiller, D., et al., "Low temperature silicon dioxide by thermal atomic layer deposition: Investigation of material properties". Journal of Applied Physics 107, 064314 (2010) pp. 1-10.*

Jakschik, Stefan, et al., "Crystallization behavior of thin ALD-Al O films". Thin Solid Films 425 (2003) 216-220.*

Cremers, Veronique, et al., "Conformality in atomic layer deposition: Current status overview of analysis and modelling". Applied Physics Reviews 6, 021302 (2019), pp. 1-43.*

Ovanesyan, Rafaiel A., et al., "Low-Temperature Conformal Atomic Layer Deposition of SiNx Films Using Si2Cl6 and NH3 Plasma". Applied Materials & Interfaces, 2015, 7, 10806-10813.*

Ansari, Mohd Zahid, et al., "Low-Temperature Atomic Layer Deposition of Highly Conformal Tin Nitride Thin Films for Energy Storage Devices". ACS Appl. Mater. Interfaces 2019, 11, 43608-43621.*

Nandi, Dip K., et al., "Low temperature atomic layer deposited molybdenum nitride-Ni-foam composite: An electrode for efficient charge storage". Electrochemistry Communications 93 (2018) 114-118.*

Shih, Huan-Yu, et al., "Low-temperature atomic layerepitaxy of AlN ultrathin films by layer-by-layer, in-situ atomic layer annealing". Scientific Reports, 7:39717, pp. 1-8.*

* cited by examiner

METHOD OF PREPARING A SAMPLE FOR PHYSICAL ANALYSIS

This application claims the benefit of Taiwanese application serial No. 108146591, filed on Dec. 19, 2019, the subject matter of which is incorporated herein by reference.

BACKGROUND OF THE INVENTION

Field of the Invention

The invention relates in general to a method of preparing a sample, and in particular to a method of preparing a sample for physical analysis.

Description of the Related Art

As the line width of the integrated circuit gradually shrinks, the defects in the previous process step in the manufacturing process often have a great impact on the yield of the next process step. Therefore, it is a serious issue to accurately find out related defects during the manufacturing process of IC.

Currently, the most commonly used instrument for fault analysis is mainly electron microscopes, such as transmission electron microscopes (TEM), scanning electron microscopes (SEM), or focused ion beam electron microscopes (FIB). The samples suitable for transmission electron microscope (TEM) observation must be physically polished, chemically etched, or slimmed by a focused ion beam (FIB) system to reduce thickness of the sample to a certain extent before observation, but the fine structure of the sample might be damaged by physically polishing, chemically etching, or slimming by a focused ion beam (FIB) system, and results in the distortion risk of the defect analysis.

Besides, before using the focused ion beam to reduce the thickness of the sample, a metal protective layer is usually plated on the sample surface. However, the surface of the sample might be broken or collapsed during the slimming process proceed by the focus ion beam (FIB) system caused by the quality of the sample surface interfered by the metal protective layer thereon, thereby a failed sample for physical analysis might be prepared. Furthermore, whether the metal protective layer is plated on the sample surface by physical vapor deposition (PVD) or chemical vapor deposition (CVD), the process temperatures thereof are both higher than 40° C., it will cause damage to the surface of biological samples, for example but not limited to foods, or cause damage to the surface of samples with relatively soft materials, such as but not limited to photoresist, glue, and so on, and the damaged surface of a sample for physical analysis is unfavorable for subsequent defect analysis.

Accordingly, a novel method of preparing a sample for physical analysis is highly expected to improve the above-mentioned disadvantages.

SUMMARY OF THE INVENTION

An aspect of this invention is to provide a method of preparing a sample for physical analysis, comprising the steps of: providing a specimen; and forming a low-temperature atomic layer deposition (ALD) film on the specimen to generate a sample for physical analysis; wherein the low-temperature atomic layer deposition (ALD) film is formed by plasma-less enhanced atomic layer deposition (PLALD) at a temperature below 40° C.

The above-mentioned method of preparing a sample for physical analysis, wherein the low-temperature atomic layer deposition (ALD) film is a metal oxide film, a metal nitride film or a metal oxynitride film.

The above-mentioned method of preparing a sample for physical analysis, wherein the metal oxide film is a titanium dioxide ($TiO_2$) film, an aluminum oxide ($Al_2O_3$) film, a hafnium dioxide ($HfO_2$) film, an indium tin oxide (ITO) film or an indium gallium zinc oxide (IGZO) film.

The above-mentioned method of preparing a sample for physical analysis, wherein the metal nitride film is an aluminum nitride (ALN) film, a molybdenum nitride (MoN) film, a titanium nitride film (TiN) or a tantalum nitride (TaN) film.

The above-mentioned method of preparing a sample for physical analysis, wherein the metal oxynitride film is a tantalum oxynitride (TaON) film.

The above-mentioned method of preparing a sample for physical analysis, further comprises a step of slimming treatment for the low-temperature atomic layer deposition (ALD) film formed on the sample for physical analysis.

The above-mentioned method of preparing a sample for physical analysis, wherein the step of slimming treatment is proceed by means of a focus ion beam (FIB) system.

The above and other aspects of the invention will become better understood with regard to the following detailed description of the preferred but non-limiting embodiment(s). These and other aspects of the invention will become apparent from the following description of the presently preferred embodiments. The detailed description is merely illustrative of the invention and does not limit the scope of the invention, which is defined by the appended claims and equivalents thereof. As would be obvious to one skilled in the art, many variations and modifications of the invention may be affected without departing from the spirit and scope of the novel concepts of the disclosure.

DETAILED DESCRIPTION OF THE INVENTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

In the following description, numerous specific details are described in detail in order to enable the reader to fully understand the following examples. However, embodiments of the present invention may be practiced in case no such specific details. In other cases, in order to simplify the drawings the structure of the apparatus known only schematically depicted in figures.

EMBODIMENT

Embodiment 1

Figure 1A:
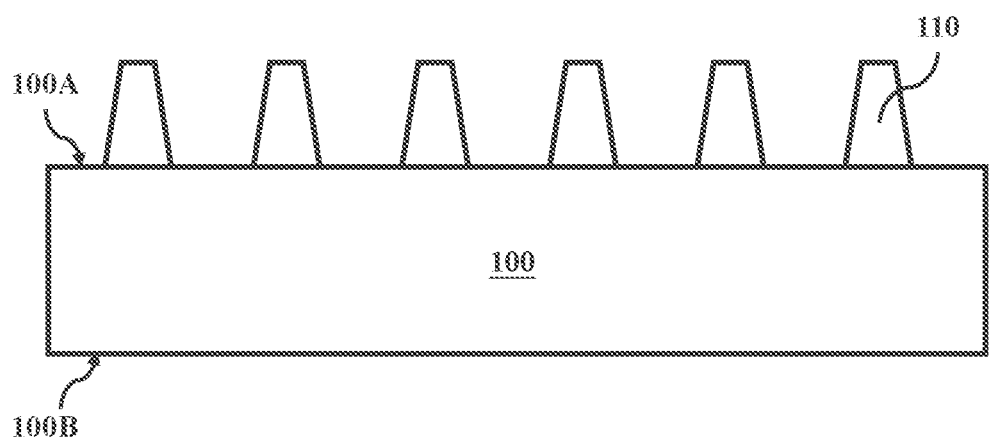
FIGS. 1A-1B are cross-sectional views illustrating steps of a method of preparing a sample 1000 for physical analysis according to Embodiment 1 of this present invention.
Figure 1B:
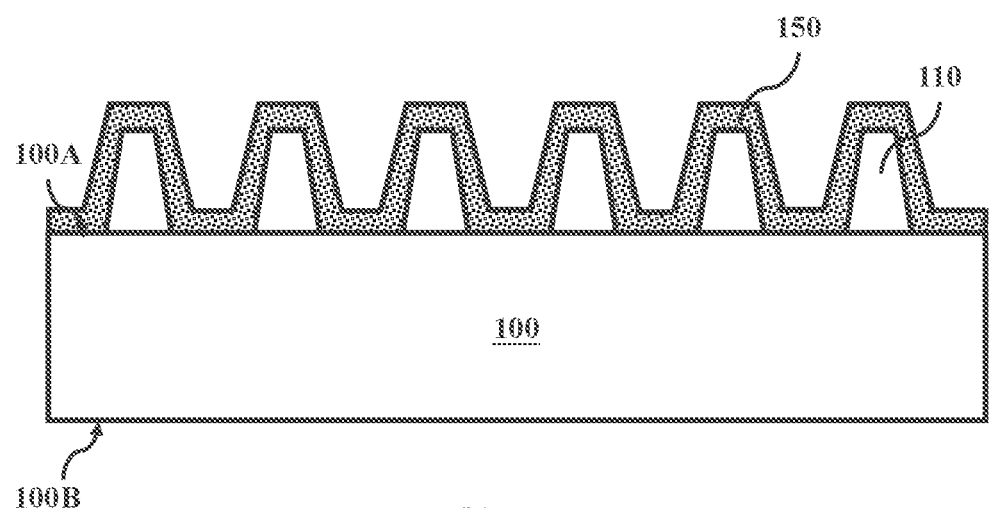

Please refer to FIGS. 1A-1B, which are cross-sectional views illustrating steps of a method of preparing a sample 1000 for physical analysis according to Embodiment 1 of this present invention.

First, as shown in FIG. 1A, a specimen 10 was provided, wherein the specimen 10 comprises a substrate 100 with a top surface 100A having a plurality of structures 110 formed thereon, and a bottom surface 100B opposite to the top surface 100A.

Next, as shown in FIG. 1B, a low-temperature atomic layer deposition (ALD) film 150 with a thickness for example but not limited to 5 Å~600 Å was formed on the top surface 100A of the sample 10 and overlay the structures 110 on the top surface 100A to generate a sample 1000 for physical analysis. The sample 1000 for physical analysis can be used for subsequent physical analysis by an electron microscope, for example but not limited to a scanning electron microscope (SEM), a transmission electron microscope (TEM) or a focused ion beam microscope (FIB).

The low-temperature atomic layer deposition (ALD) film 150 was formed by plasma-less enhanced atomic layer deposition (PLALD) at a temperature below 40° C. The low-temperature atomic layer deposition (ALD) film 150 can be for example but not limited to a metal oxide film, a metal nitride film or a metal oxynitride film.

The above-mentioned metal oxide film is for example but not limited to a titanium dioxide ($TiO_2$) film, an aluminum oxide ($Al_2O_3$) film, a hafnium dioxide ($HfO_2$) film, an indium tin oxide (ITO) film or an indium gallium zinc oxide (IGZO) film.

The above-mentioned metal nitride film is for example but not limited to an aluminum nitride (ALN) film, a molybdenum nitride (MoN) film, a titanium nitride film (TiN) or a tantalum nitride (TaN) film.

The above-mentioned metal oxynitride film is for example but not limited to a tantalum oxynitride (TaON) film.

Embodiment 2

Figure 2A:
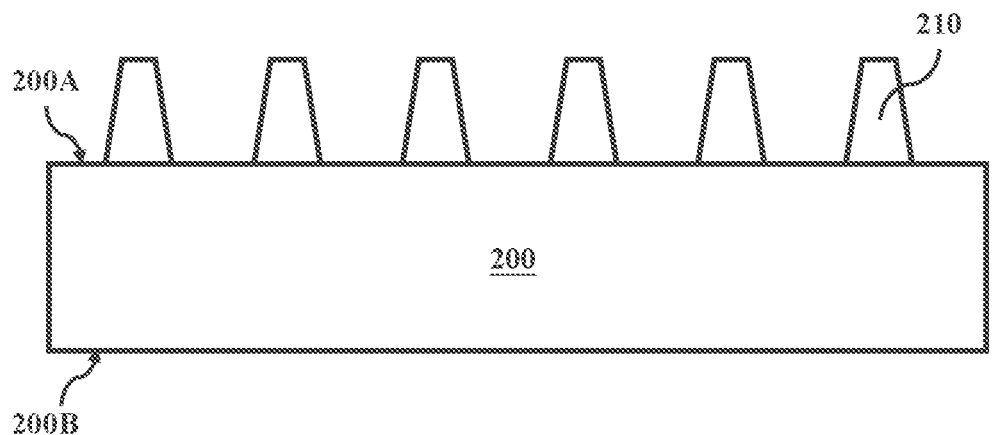
FIGS. 2A-2C are cross-sectional views illustrating steps of a method of preparing a sample 2000 for physical analysis according to Embodiment 2 of this present invention.
Figure 2B:
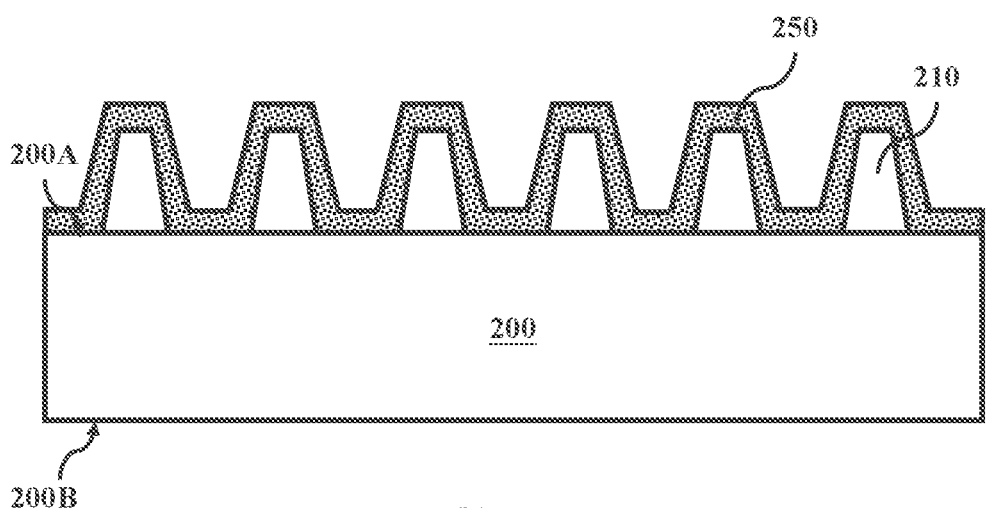
Figure 2C:
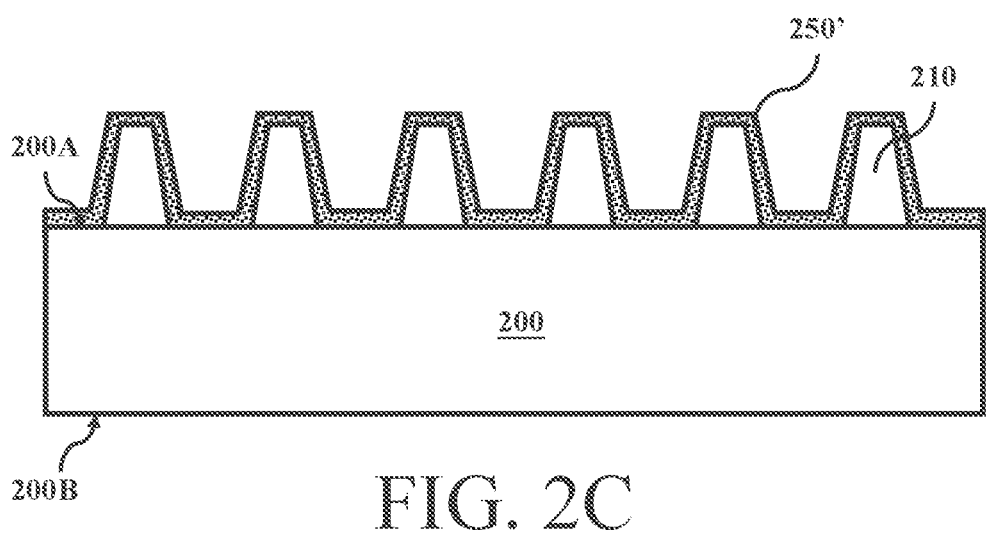

Please refer to FIGS. 2A-2C, which are cross-sectional views illustrating steps of a method of preparing a sample 2000 for physical analysis according to Embodiment 2 of this present invention.

First, as shown in FIG. 2A, a sample 20 was provided, wherein the specimen 20 comprises a substrate 200 with a top surface 200A having a plurality of structures 210 formed thereon, and a bottom surface 200B opposite to the top surface 200A.

Next, as shown in FIG. 2B, a low-temperature atomic layer deposition (ALD) film 250 with a thickness for example but not limited to 5 Å~600 Å was formed on the top surface 200A of the specimen 20 and overlay the structures 210 on the top surface 200A. The low-temperature atomic layer deposition (ALD) film 250 was formed by plasma-less enhanced atomic layer deposition (PLALD) at a temperature below 40° C. The low-temperature atomic layer deposition (ALD) film 250 can be for example but not limited to a metal oxide film, a metal nitride film or a metal oxynitride film.

Next, as shown in FIG. 2C, the low-temperature atomic layer deposition (ALD) film 250 was slimmed by a focus ion beam system (FIB) to form a slimmed low-temperature atomic layer deposition (ALD) film 250' formed on the top surface 200A of the sample 20 and overlay the structures 210 on the top surface 200A to generate a sample 2000 for physical analysis. The sample 2000 for physical analysis can be used for subsequent physical analysis by an electron microscope, for example but not limited to a scanning electron microscope (SEM), a transmission electron microscope (TEM) or a focused ion beam microscope (FIB).

The above-mentioned metal oxide film is for example but not limited to a titanium dioxide ($TiO_2$) film, an aluminum oxide ($Al_2O_3$) film, a hafnium dioxide ($HfO_2$) film, an indium tin oxide (ITO) film or an indium gallium zinc oxide (IGZO) film.

The above-mentioned metal nitride film is for example but not limited to an aluminum nitride (ALN) film, a molybdenum nitride (MoN) film, a titanium nitride film (TiN) or a tantalum nitride (TaN) film.

The above-mentioned metal oxynitride film is for example but not limited to a tantalum oxynitride (TaON) film.

To sum up, the method of preparing a sample for physical analysis according to this invention can improve the disadvantages suffered by the conventional method of preparing a sample for physical analysis by forming a low-temperature atomic layer deposition (ALD) film on the sample, thereby the surfaces of biological samples or samples with relatively soft materials will not be damaged and favorable for subsequent precise defect analysis.

Although particular embodiments have been shown and described, it should be understood that the above discussion is not intended to limit the present invention to these embodiments. Persons skilled in the art will understand that various changes and modifications may be made without departing from the scope of the present invention as literally and equivalently covered by the following claims.

What is claimed is:

1. A method of preparing a sample for physical analysis, comprising the steps of:
   providing a specimen; and
   forming a low-temperature atomic layer deposition (ALD) film on the specimen to generate a sample for physical analysis;
   wherein the low-temperature atomic layer deposition (ALD) film is formed by plasma-less enhanced atomic layer deposition (PLALD) at a temperature below 40° C.;
   wherein the low-temperature atomic layer deposition (ALD) film is a metal nitride film or a metal oxynitride film.

2. The method of preparing a sample for physical analysis as claimed in claim 1, wherein the metal nitride film is an aluminum nitride (ALN) film, a molybdenum nitride (MoN) film, a titanium nitride film (TiN) or a tantalum nitride (TaN) film.

3. The method of preparing a sample for physical analysis as claimed in claim 2, further comprising a step of slimming treatment for the low-temperature atomic layer deposition (ALD) film formed on the sample for physical analysis.

4. The method of preparing a sample for physical analysis as claimed in claim 3, wherein the step of slimming treatment is proceed by a focus ion beam (FIB) system.

5. The method of preparing a sample for physical analysis as claimed in claim 1, wherein the metal oxynitride film is a tantalum oxynitride (TaON) film.

6. The method of preparing a sample for physical analysis as claimed in claim 5, further comprising a step of slimming treatment for the low-temperature atomic layer deposition (ALD) film formed on the sample for physical analysis.

7. The method of preparing a sample for physical analysis as claimed in claim 6, wherein the step of slimming treatment is proceed by a focus ion beam (FIB) system.

8. The method of preparing a sample for physical analysis as claimed in claim 1, further comprising a step of slimming treatment for the low-temperature atomic layer deposition (ALD) film formed on the sample for physical analysis.

9. The method of preparing a sample for physical analysis as claimed in claim 8, wherein the step of slimming treatment is proceed by a focus ion beam (FIB) system.

* * * * *